United States Patent
Singhal et al.

(10) Patent No.: US 11,328,755 B2
(45) Date of Patent: May 10, 2022

(54) DATA TRANSMISSION BETWEEN CLOCK DOMAINS FOR CIRCUITS SUCH AS MICROCONTROLLERS

(71) Applicant: Silicon Laboratories Inc., Austin, TX (US)

(72) Inventors: Arjun Singhal, Singapore (SG); Subrata Roy, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 250 days.

(21) Appl. No.: 16/839,329

(22) Filed: Apr. 3, 2020

(65) Prior Publication Data

US 2021/0312962 A1  Oct. 7, 2021

(51) Int. Cl.

| G06F 1/12 | (2006.01) |
| G11C 7/22 | (2006.01) |
| G06F 1/3234 | (2019.01) |
| G11C 7/10 | (2006.01) |
| G06F 3/06 | (2006.01) |

(52) U.S. Cl.
CPC ............ *G11C 7/222* (2013.01); *G06F 1/12* (2013.01); *G06F 1/3275* (2013.01); *G06F 3/0656* (2013.01); *G11C 7/1057* (2013.01); *G11C 7/1084* (2013.01); *G11C 7/225* (2013.01)

(58) Field of Classification Search
CPC ..... G11C 7/222; G11C 7/1057; G11C 7/1084; G11C 7/225; G06F 1/12; G06F 1/3275; G06F 3/0656
See application file for complete search history.

(56) References Cited

U.S. PATENT DOCUMENTS 6,055,285 A * 4/2000 Alston ...................... G06F 5/10
                                                  375/356
10,509,760 B2 * 12/2019 Lee .......................... G11C 7/10

OTHER PUBLICATIONS

Jens Sparso; "Asynchronous Circuit Design, a Tutorial"; 2006; Technical University of Denmark; Anker Engelunds Vej 1, Building 101A, 2800 Kgs., Lyngby, Denmark; 7 pages.

* cited by examiner

*Primary Examiner* — Idriss N Alrobaye
*Assistant Examiner* — Richard B Franklin
(74) *Attorney, Agent, or Firm* — Polansky & Associates, P.L.L.C.; Paul J. Polansky

(57) ABSTRACT

A data producer stores input data in a buffer in response to a slow clock signal and provides read data from the buffer in response to a read pointer signal. A data movement circuit reads the input data from the buffer using the read pointer signal and provides an update read pointer signal in response to reading the input data. The data movement circuit operates in response to a fast clock signal, and includes a metastable-free synchronizer circuit having inputs for receiving the update read pointer signal, the slow clock signal, and the read pointer signal, and an output for providing a synchronized read pointer signal equal to the read pointer signal except between a change in the read pointer signal while the slow clock signal is active until an inactivation of the slow clock signal. The buffer provides the read data in response to the synchronized read pointer signal.

32 Claims, 5 Drawing Sheets

DATA TRANSMISSION BETWEEN CLOCK DOMAINS FOR CIRCUITS SUCH AS MICROCONTROLLERS

FIELD

The present disclosure relates generally to data transmission circuits, and more particularly to data transmission circuits that transmit data between two circuits operating in different clock domains.

BACKGROUND

Microcontrollers (MCUs) are integrated circuits that combine the main components of a computer system, i.e. a central processing unit (CPU), memory, and input/output (I/O) peripheral circuits, on a single integrated circuit chip. MCUs have found widespread use for various control functions in industrial, automotive, home, and mobile environments. One important feature of modern MCUs is their ability to operate using extremely low amounts of power, especially during periods of inactivity, while maintaining their states and waking up when needed. MCUs predominantly use complementary metal-oxide-semiconductor (CMOS) transistors because CMOS logic circuits use near zero static power, their dynamic power consumption is proportional to the switching frequency, and they can also retain their states without receiving clock signals. In certain low power modes, most of the MCU such as the CPU stops operating, while portions of the MCU, for example input/output circuits or sensor inputs, remain active but operate at a significantly reduced frequency. These circuits are useful to continue operations while in the low-power states, but wake up the CPU when necessary. However the difference in frequency of operation between the CPU and the peripherals makes it difficult to exchange data between these circuits while maintaining low power consumption.

Figure 1:
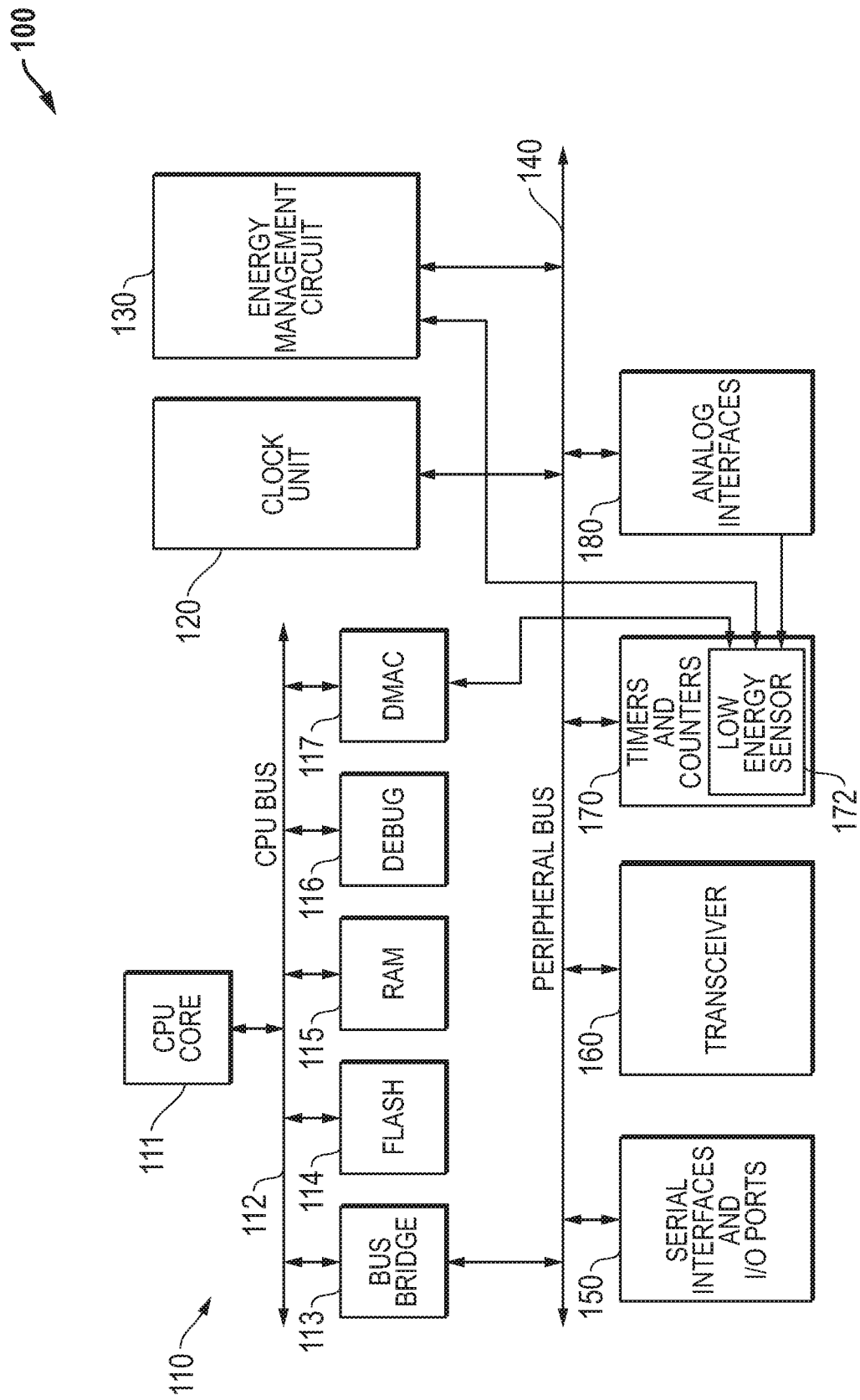
FIG. 1 illustrates in block diagram form an MCU with a low-energy sensor according to an embodiment.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

In one form, a circuit includes a data producer and a data movement circuit. The data producer stores input data in a buffer in response to a slow clock signal, and provides read data from the buffer in response to a read pointer signal. The data movement circuit is operable to control the data producer to read the input data from the buffer using the read pointer signal and to provide an update read pointer signal in response to reading the input data. The data movement circuit operates in response to a fast clock signal having a higher frequency than the slow clock signal. The data producer includes a metastable-free synchronizer circuit having a first input for receiving the update read pointer signal, a second input for receiving the slow clock signal, a third input for receiving the read pointer signal, and an output for providing a synchronized read pointer signal that is equal to the read pointer signal except between a change in the read pointer signal while the slow clock signal is active until an inactivation of the slow clock signal. The buffer provides the read data to the data movement circuit in response to the synchronized read pointer signal.

In another form, a microcontroller includes a sensor circuit and a data movement circuit. The sensor circuit stores sensor data in a buffer in response to a slow clock signal, and provides read sensor data from the buffer in response to a read pointer signal. The data movement circuit is operable in an active mode and a first low-power mode to control the sensor circuit to read the sensor data from the buffer using the read pointer signal, and to provide an update read pointer signal in response to reading the sensor data. The data movement circuit operates in response to a fast clock signal having a higher frequency than the slow clock signal. The sensor circuit includes a metastable-free synchronizer circuit having a first input for receiving the update read pointer signal, a second input for receiving the slow clock signal, a third input for receiving the read pointer signal, and an output for providing a synchronized read pointer signal that is equal to the read pointer signal except between a change in the pointer signal while the slow clock signal is active until an inactivation of the slow clock signal. The buffer provides the read sensor data to the data movement circuit in response to the synchronized read pointer signal.

In yet another form, a method includes storing input data in a buffer at a location indicated by a write pointer in synchronism with a slow clock signal. A control signal to indicate that the buffer has reached a predetermined condition is provided. Data is read from the buffer in response to the control signal at a location indicated by a read pointer signal in synchronism with a fast clock signal having a higher frequency than the slow clock signal. An update read pointer signal is generated in synchronism with the fast clock signal in response to reading the input data from the buffer. A synchronized read pointer signal is formed in response to the read pointer signal and the update read pointer signal using a metastable-free synchronizer circuit that forms a metastable-free update read pointer signal as the update read pointer signal when the slow clock signal and the update read pointer signal do not change at the same time, and keeps the metastable-free update read pointer signal inactive except between a change in the read pointer signal while the slow clock signal is active until an inactivation of the slow clock signal, and latches the read pointer signal in response to the metastable-free update read pointer signal.

FIG. 1 illustrates in block diagram form an MCU 100 with a low-energy sensor according to an embodiment. MCU 100 is an integrated circuit that includes generally a CPU system 110, a clock unit 120, an energy management circuit 130, a peripheral bus 140, a set of serial interfaces and I/O ports 150, a transceiver 160, a set of timers and counters 170, and a set of analog interfaces 180.

CPU system 110 includes a CPU bus 112 interconnecting a CPU core 111, a bus bridge 113, a FLASH memory 114, a random-access memory (RAM) 115, a debug circuit 116, and a direct memory access controller (DMAC) 117. CPU system 110 includes a CPU bus 112 separate from peripheral bus 140 to isolate transactions initiated by CPU core 111 to local devices and memory without affecting traffic on peripheral bus 140. Bus bridge 113 is a circuit that allows cross-bus transfers between CPU bus 112 and peripheral bus 140. CPU system 110 provides FLASH memory 114 for non-volatile storage of program code that can be bootstrap loaded from an external source, as well as parameters that need to be preserved when MCU 100 is powered down. RAM 115 provides a working memory for use by CPU core 111. Debug circuit 116 provides program trace capabilities with access to registers on CPU core 111 for software debug. DMAC 117 provides programmable direct memory access channels to offload CPU core 111 from routine data movement tasks between peripherals and memory.

MCU 100 includes a set of peripherals that make it suitable for a variety of general-purpose embedded applications. Peripheral bus 140 interconnects bus bridge 113, clock unit 120, energy management circuit 130, serial interfaces and I/O ports 150, transceiver 160, timers and counters 170, and analog interfaces 180. In serial interfaces and I/O ports 150, the serial interfaces operate according to a variety of synchronous and asynchronous character-oriented and serial protocols. The I/O ports are a set of general-purpose input/output circuits with terminals that can be programmed for specific functions or remain available to software for general purpose operation. Timers and counters 170 provide various programmable timing and event counting functions useful for embedded control, and include a watchdog timer and a real time clock. Analog interfaces 180 include an analog comparator and analog-to-digital converter (ADC) for accurate analog input signal measurement.

In particular, timers and counters 170 includes a special peripheral known as a low energy sensor 172. Low energy sensor 172 is a sensor interface circuit that utilizes on-chip peripherals to perform measurement using a configurable set of sensors. It is active in various low-power modes of MCU 100, and can wake up CPU core 111 based on the occurrence of a configurable set of events. To reduce power while operating the low power modes, low energy sensor 172 operates using a slow clock that can have a frequency of, for example, 32 kilohertz (kHz), which the CPU and other digital circuits can operate using a fast clock signal having a frequency of, for example, 20 megahertz (MHz). This difference in speed between the slow clock and the fact clock presents a challenge for communicating signals between the low energy sensor and the digital circuits while preserving extremely low standby power.

Generally, MCU 100 integrates CPU system 110 and several peripherals for a wide variety of application environments and is suitable for very low power operation. MCU 100 includes a clock unit 120 that provides a variety of clocks and clock functions that MCU 100 uses to support its low power modes. For example, clock unit 120 can include high frequency oscillators, as well as lower precision fully integrated resistor-capacitor (RC) oscillators and very low speed RC oscillators that allow standby and keep-alive operations.

MCU 100 also includes energy management circuit 130 to implement a power architecture that provides several programmable functions to support extremely low-power operation in low-power modes. Energy management circuit 130 also provides other functions besides voltage generation. For example, energy management circuit 130 provides a state machine to control entry into and exit from various low-power states. These states are highlighted in TABLE I below:

TABLE II

| State | Internal Circuits |
| --- | --- |
| EM0 (Active) | All internal circuits, including CPU core 111, are active |
| EM1 (Sleep) | CPU core 111 is in sleep mode and clocks are gated off; high- and low-frequency clocks continue to be generated; all internal circuits are powered; power consumption is reduced from ACTIVE state; wakeup latency is low |
| EM1P (Sleep-Peripheral) | CPU core 111 is in sleep mode and clocks are gated off; high-frequency clocks are disabled but low-frequency clocks continue to be generated; selected internal peripherals are disabled while other internal peripherals operate, including low energy sensor 172 using a low-frequency clock; I/O signals are held in previous logic states; power consumption is reduced from IDLE state; wakeup latency is medium |
| EM2 (Deep Sleep) | CPU core 111 is off (power supply is removed and clocks are disabled); high-frequency and some low-frequency clocks are disabled; all internal circuits are disabled except a wakeup timer using low-speed clock and low energy sensor 172; DMAC 117 can be awakened; wakeup latency is high |
| EM3 (Stop) | CPU core 111 is off (power supply is removed and clocks are disabled); high-frequency and most low-frequency clocks are disabled; all internal circuits are disabled except wakeup timer and low-frequency clock; low energy sensor 172 is inactive; DMAC 117 can be awakened; wakeup latency is very high |
| EM4 (Shutoff) | CPU core 111 is off (power supply is removed and clocks are disabled); a SHUTDOWN state is latched internally; all peripherals are inactive except for an ultra low-frequency oscillator and an ultra low-frequency timer, pin reset function, and general-purpose input/output (GPIO) pin states are still available |

Figure 2:
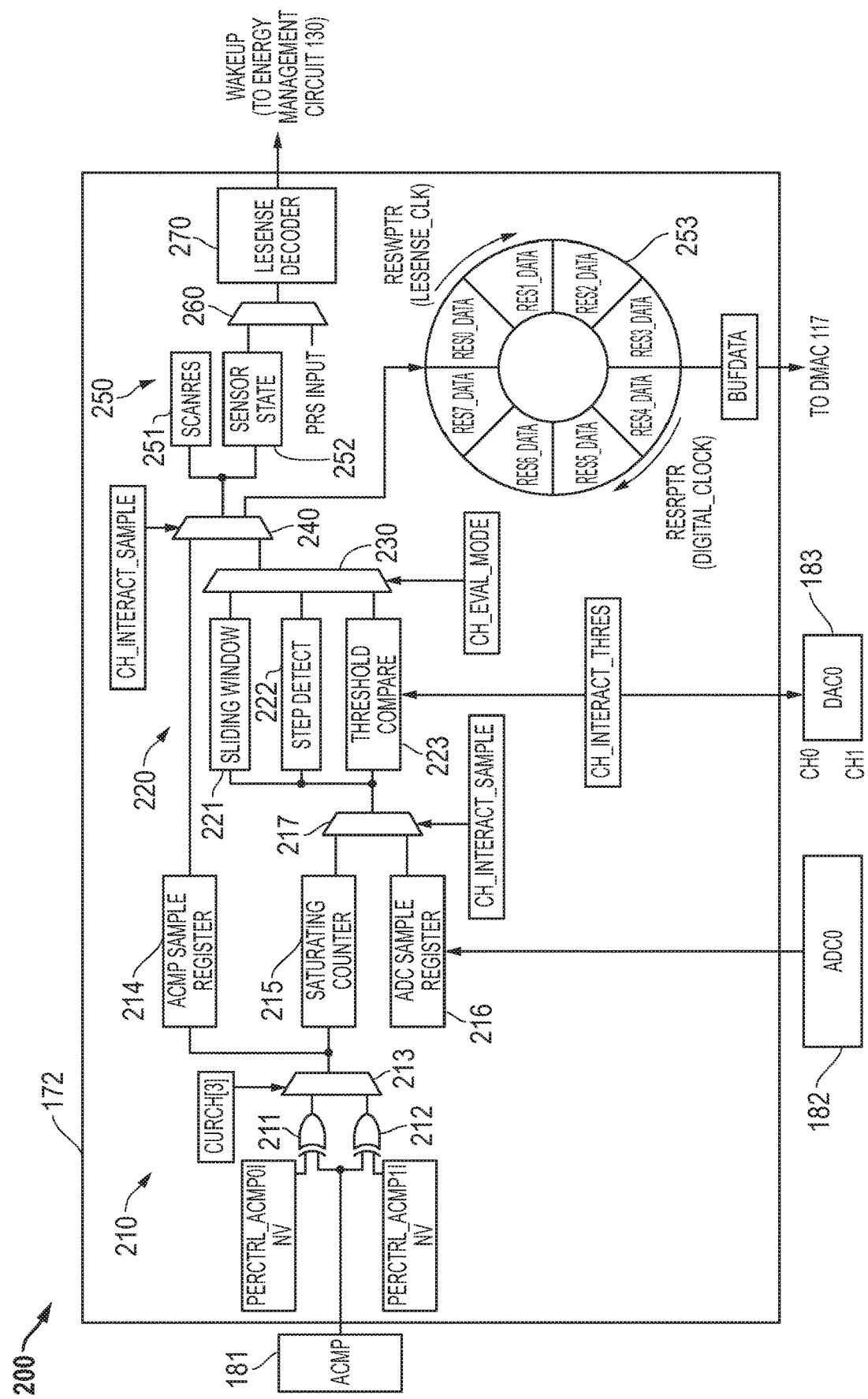
FIG. 2 illustrates in block diagram form a portion of the low energy sensor of FIG. 1.

FIG. 2 illustrates in block diagram form low energy sensor 172 of FIG. 1. Low energy sensor 172 includes generally a sensor input circuit 210, input conditioning circuits 220, a selector 230, a selector 240, a set of results circuits 250, a selector 260, and a decoder 270 labeled "LESENSE DECODER". Also shown in FIG. 2 is an analog comparators block 181 labeled "ACMP", an analog-to-digital converter 182 labeled "ADC0", and a digital-to-analog converter 183 labeled "DAC0", all three of which are components of analog interfaces 180 of FIG. 1.

Sensor input circuit 210 includes exclusive OR gates 211 and 212, a selector 213, an ACMP sample register 214, a saturating counter 215, an ADC sample register 216, and a selector 217. Exclusive OR gate 211 has a first input for receiving a digital signal representing the result of a comparison of an analog signal of a first channel to a corresponding threshold, a second input for receiving a programmable inversion control signal labeled "ACMP0 INV", and an output. Exclusive OR gate 212 has a first input for receiving a digital signal representing the result of a comparison of an analog signal of a second channel to a corresponding threshold, a second input for receiving a programmable inversion control signal labeled "ACMP1 INV", and an output. Selector 213 has a first input connected to the output of exclusive OR gate 211, a second input connected to the output of exclusive OR gate 212, an output, and a control input for receiving a user-programmable selection control signal labeled "CURCH[3]". ACMP sample register 214 has an input connected to the output of selector 213, and an output. Saturating counter 215 has an input connected to the output of selector 213, and an output. ADC sample register 216 has an input connected to an output of analog-to-digital converter 182, and an output. Selector 217 has a first input connected to the output of saturating counter 215, a second input connected to the output of ADC sample register 216, a control input for receiving a user-programmable selection control signal labeled "CH_INTERACT_SAMPLE", and an output.

Input conditioning circuits 220 include a sliding window circuit 221, a step detect circuit 222, and a threshold compare circuit 223. Sliding window circuit 221 has an input connected to the output of selector 217, and an output. Step detect circuit 221 has an input connected to the output of selector 217, and an output. Threshold compare circuit 221 has an input connected to the output of selector 217, and an output.

Selector 230 has a first input connected to the output of sliding window circuit 221, a second input connected to the output of step detect circuit 222, a third input connected to the output of threshold compare circuit 223, a control input for receiving a user-programmable selection control signal labeled "CH_EVAL_MODE", and an output.

Selector 240 has a first input connected to the output of ACMP sample register 214, a second input connected to the output of selector 230, a control input for receiving a user-programmable selection control signal labeled "CH_INTERACT_SAMPLE", and an output.

Results circuits 250 include a scan register 251 labeled "SCANRES", a sensor state register 252 labeled "SENSORSTATE", and a first-in, first-out buffer (FIFO) 253. Scan register 251 has an input connected to the output of selector 240, and an output (not shown in FIG. 2). Sensor state register 252 has an input connected to the output of selector 240, and an output. FIFO 253 has an input connected to the output of selector 240, and an output for providing a data signal labeled "BUFDATA", for example to DMAC 117 of FIG. 1. FIFO 253 includes a set of entries shown in FIG. 2 as separate parts of a buffer shown as a circle in which data is written in response to a write pointer labeled "RESWPTR" synchronized to a clock signal for LESENSE block 172 labeled "LESENSE_CLK", and that is read in response to a read pointer labeled "RESRPTR" synchronized to a clock signal for the digital circuits in MCYU 100 labeled "DIGITAL_CLOCK". Further details of FIFO 253 will be described below.

In general, low energy sensor 172 is a module capable of controlling on-chip peripherals to perform monitoring of different sensors with little or no intervention from CPU core 111. Low energy sensor 172 uses analog comparators 181 or an analog-to-digital converter (ADC) in analog interfaces 180 for measurement of sensor signals. It can also control the on-chip DACs such as DAC 183 to generate accurate reference voltages.

LESENSE decoder 270 can process results from sensor measurements and is a configurable state machine (configured from data stored in an internal random access memory, not shown in FIG. 2) with up to 32 states and 64 arcs with programmable actions on state transitions. LESENSE decoder 270 is programmable to implement a wide range of decoding schemes, such as quadrature decoding. It evaluates measurements and makes decisions about whether to provide the WAKEUP signal to wake up change a power mode, or other signals, not shown in FIG. 2, to wake up a peripheral or to interrupt CPU core 111 to change program flow to process the results. Low energy sensor 172 stores measurement results in FIFO 253, which enables MCU 100 to remain in a low-energy mode for long periods of time while collecting sensor data. The sensor data can eventually be collected by CPU core 111 or DMAC 117 for further processing.

Most components of low energy sensor 172 operate based on a relatively low-speed LESENSE_CLK that may operate, for example, at speeds as low as 32 kilohertz (kHz) to allow low power operation during long periods of time. As will be explained below, the collection of data in FIFO 253 presents challenges for transferring data from low energy sensor 172 to either CPU core 111 or DMAC 117 through FIFO 253 without consuming significant amounts of power when using known data transmission circuits.

Figure 3:
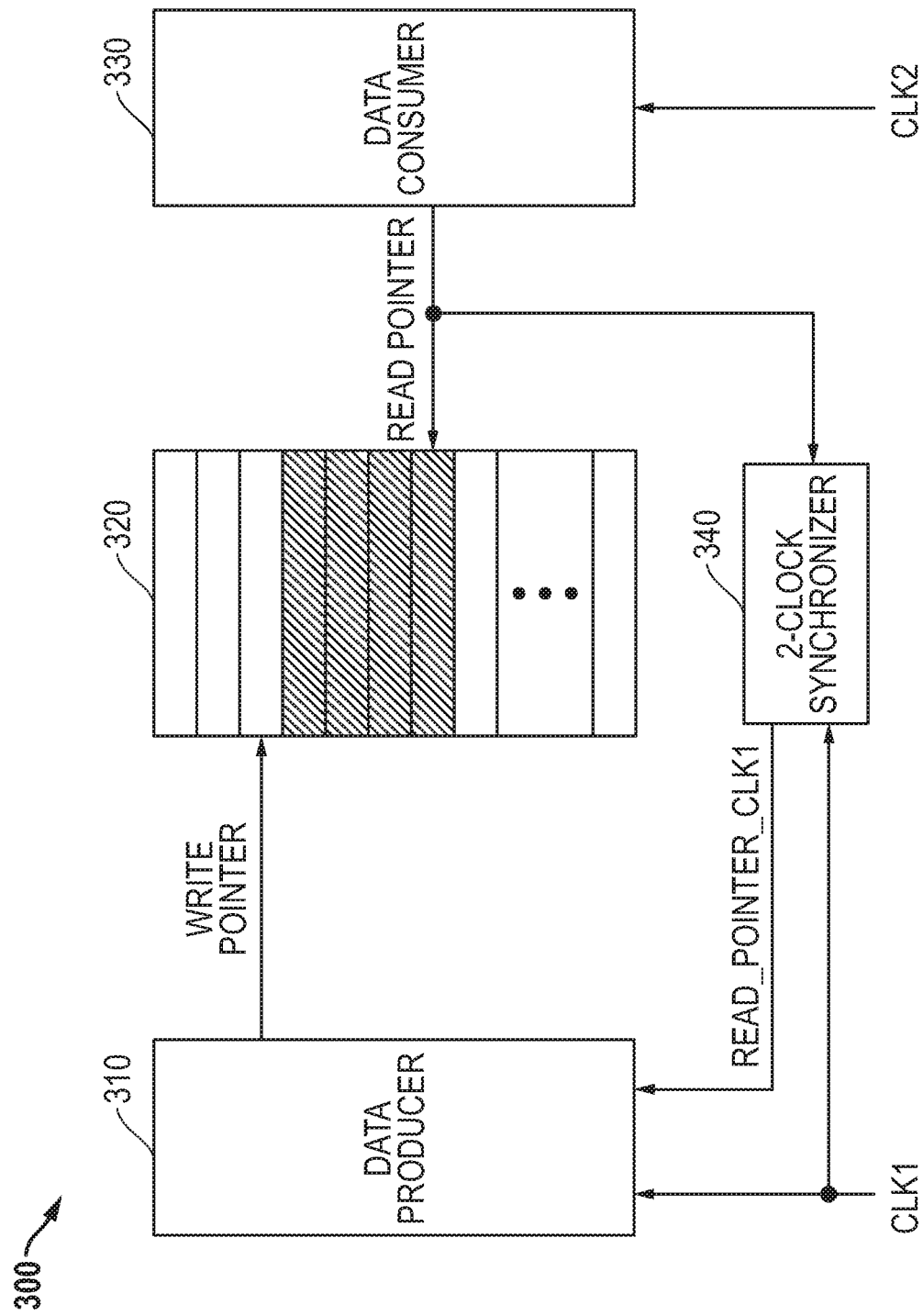
FIG. 3 illustrates in block diagram form a data transmission circuit known in the prior art.

FIG. 3 illustrates in block diagram form a data transmission circuit 300 known in the prior art. Data transmission circuit 300 includes a data producer 310, a first-in, first-out buffer (FIFO) 320, a data consumer 330, and a 2-clock synchronizer 340. Data producer 310 has a first input for receiving a first clock signal labelled "CLK1", a second input for receiving a synchronized clock signal labeled "READ_POINTER_CLK1", a first output for providing a signal labeled "WRITE POINTER", and a second output (not shown in FIG. 3) for providing write data. FIFO 320 has a first input connected to the first output of data producer 310 for receiving the WRITE POINTER, in input (not shown in FIG. 3) connected to the second output of data producer 310 for receiving the write data, a third input for receiving a signal labelled "READ POINTER", and an output for providing read data (not shown in FIG. 3). FIFO 320 includes set of entries in which full entries (i.e. entries with valid data that have not yet been read) are shown as cross-hatched boxes, and empty entries (i.e. entries with invalid data or whose data has already been read) are shown as empty boxes. Data consumer 330 has a first input for receiving a clock signal labelled "CLK2", a second input connected to the output of FIFO 320, and an output for providing the READ POINTER to the third input of FIFO 320. 2-clock synchronizer 340 has a first input connected to the output of data consumer 330, a second input for receiving the CLK1 signal, and an output connected to the second input of data producer 310 for providing a signal labelled "READ_POINTER_CLK1" thereto.

Data transmission circuit 300 transmits data generated or collected by data producer 310 that operates in a first clock domain operating according to the CLK1 signal, to a data consumer that receives and processes the data in a second clock domain according to the CLK2 signal. FIFO 320 is a first-in, first-out buffer whose valid entries extend between the WRITE POINTER and the READ POINTER. As shown in FIG. 2, FIFO 320 has four valid entries, and the WRITE POINTER points to the location where the next data will be stored in FIFO 320, and the READ POINTER points to the location of the next data to be read from FIFO 320. After data producer 310 stores another data element in FIFO 320, it increments the WRITE POINTER, while after data consumer 330 reads another data element from FIFO 320, it increments the READ POINTER.

Data producer 310 and data consumer 330 operate in different clock domains, in which the CLK1 and CLK2 signals have potentially different frequencies and have a random and generally changing phase relationship to each other. It is important for data producer 310 to prevent FIFO overruns, i.e. conditions in which it writes data over a valid, unread data element. Similarly, data producer 310 needs to prevent FIFO underruns, i.e. conditions in which there is no valid data. Thus, in order for data producer 310 to determine the degree of fullness of FIFO 320, it needs to compare the READ POINTER to the WRITE POINTER. Because the READ POINTER is changing asynchronously to the CLK1 signal, data producer 310 needs to synchronize the READ POINTER to its own clock domain, the CLK1 domain. Data transmission circuit 300 includes a 2-clock synchronizer 340 to synchronize the READ POINTER to the CLK1 domain. In many cases, 2-clock synchronizer 340 is sufficient to form READ POINTER CLK1 so that data producer 310 can provide more data to avoid underruns, especially if it uses low watermarks.

However, in some circumstances, data transmission circuit 300 is insufficient. For example, if the CLK1 domain is significantly slower than the CLK2 domain, then data consumer 330 will be able to empty FIFO 320 faster than data producer 310 determine that the FIFO is about to underrun. For example, in MCU 100 low energy sensor 172 is a data producer that can operate at 32 kHz, while CPU core 111 or DMAC 117 is a data consumer that can operate at a significantly higher frequency, such as 20 MHz. In this case, low energy sensor 172 would be unable to detect the underrun within two CLK1 cycles because CPU 11 or DMAC 117 can completely empty the FIFO in less than two CLK1 cycle because it operates on the significantly faster CLK2 domain. Thus, a new data transmission circuit is needed.

Figure 4:
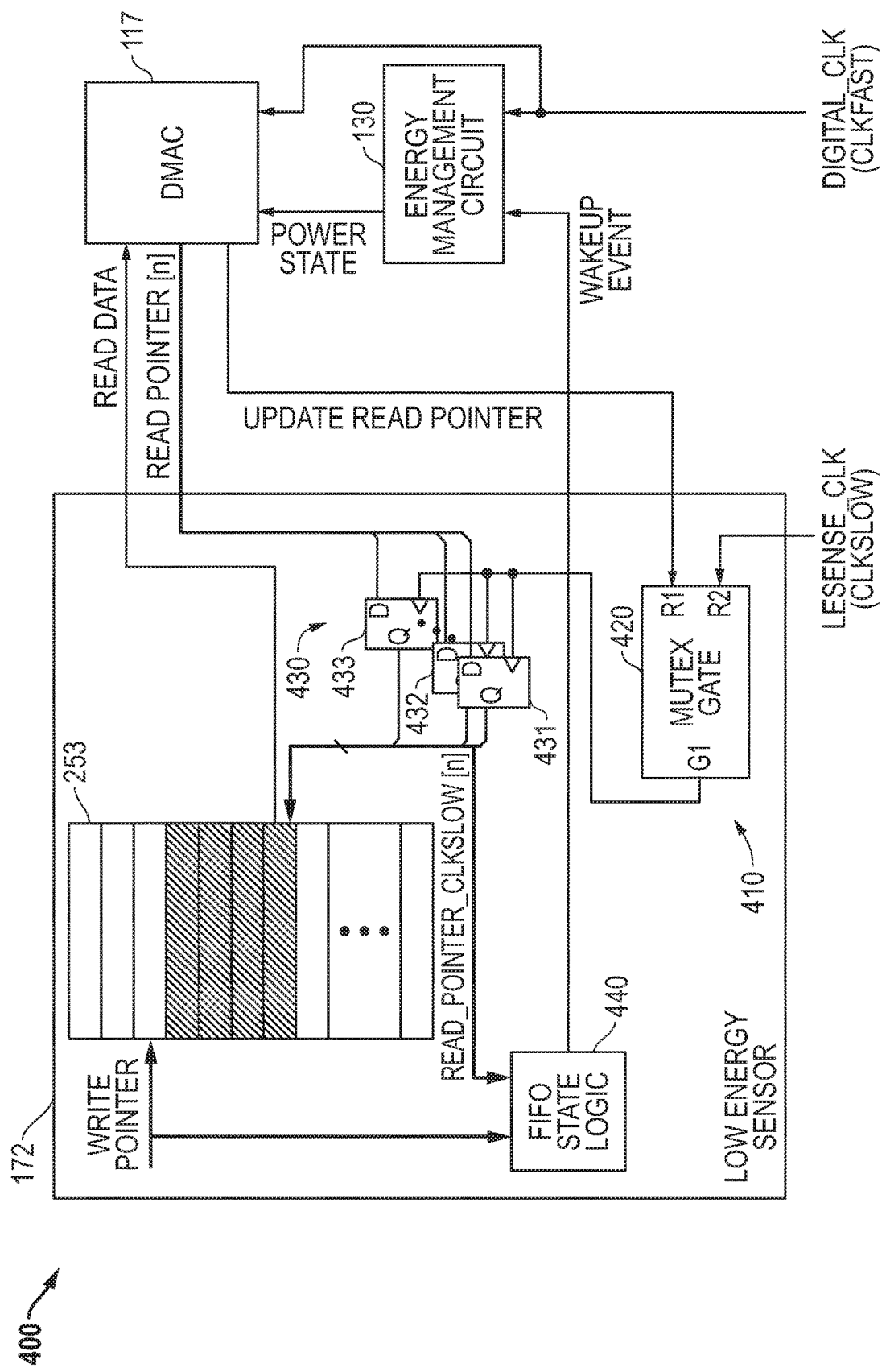
FIG. 4 illustrates in block diagram form a portion of the integrated circuit of FIG. 1 showing the data transmission circuitry between the low energy sensor and the DMA controller.

FIG. 4 illustrates in block diagram form a portion 400 of MCU 100 of FIG. 1 showing data transmission circuitry between low energy sensor 172 and DMAC 117. Low energy sensor 172 includes the circuitry shown in FIG. 2 plus additional circuitry that will now be described. This additional circuitry includes a metastable-free synchronizer circuit 410 and a FIFO state logic circuit 440.

Metastable-free synchronizer circuit 410 includes a mutual exclusion (MUTEX) gate 420 and a latch 430. MUTEX gate 420 has a first request input labelled "R1" for receiving a signal labeled "UPDATE READ POINTER", a second request input labelled "R2" for receiving the LESENSE_CLK signal, and a first grant output labelled "G1" for providing a metastable-free update read pointer signal. Latch 430 receives an n-bit read pointer signal labelled "READ POINTER [n]", and latches READ POINTER [n] on the rising edge of the metastable-free update read pointer signal to provide a synchronized n-bit read pointer signal labeled "READ_POINTER_CLKSLOW [n]". In particular, latch 430 includes a set of D-type clocked latches corresponding to respective bits of the READ POINTER [n] signal, including three representative latches 431, 432, and 433 shown in FIG. 4. Each of latches 431, 432, and 433 has a D input for receiving a corresponding bit of the READ POINTER [n] signal, a clock input connected to the G1 output of MUTEX gate 420, and an output for providing a corresponding bit of the READ_POINTER_CLKLSLOW [n] signal.

FIFO state logic circuit 440 has a first input for receiving the WRITE POINTER signal, a second input for receiving the READ_POINTER_CLKSLOW [n] signal, and an output for providing a control signal labeled "WAKEUP EVENT". Although not specifically highlighted in FIG. 4, the WRITE POINTER signal is also an n-bit signal with the same number of bits as the READ POINTER [n] signal.

Portion 400 also illustrates relevant details of energy management circuit 130 and DMAC 117. Energy management circuit 113 has a first input connected to the output of FIFO state logic circuit 440, a second input for receiving the DIGITAL_CLK signal, and an output for providing a control signal labeled "POWER STATE". DMAC 117 has a first input connected to the output of energy management circuit 130 for receiving the POWER STATE signal, a second input for receiving the DIGITAL_CLK signal, a third input connected to FIFO 253 for receiving a read data signal labeled "READ DATA", a first output for providing the READ POINTER [n] signal, and a second output for providing the UPDATE READ POINTER signal.

In operation, low energy sensor 172 operates using the LESENSE_CLK, also designated "CLKSLOW", with a relatively low clock speed. For example, when MCU 100 is in a low power mode, low energy sensor 172 gathers inputs using a very slow clock signal which can have a frequency of, for example, 32 kilohertz (32 kHz). In this way, low energy sensor 172 consumes very little energy, consistent with the need to conserve power and/or battery life in the low power state. DMAC 117 operates using the DIGITAL CLK signal, also designated "CLKFAST", with a relatively high clock speed. Thus, DMAC 117 gathers data from FIFO 253 at the higher clock speed that can have a frequency of, for example, 20 megahertz (MHz). Metastable-free synchronizer circuit 410 is useful when the CLKFAST signal is faster than the CLKSLOW signal by at lease one order of magnitude. In the illustrated embodiment, the CLKFAST signal is faster than the CLKSLOW signal by three orders of magnitude, although this difference could be greater still.

In general, FIFO state logic circuit 440 determines whether low energy sensor 172 has reached a predetermined degree of fullness, i.e. it has stored so much data in FIFO 253 that it needs to be emptied. FIFO state logic circuit 440 activates the WAKEUP EVENT signal in response to reaching a certain programmable state indicated by the relationship between the read and write pointers. In one example of reaching the predetermined degree of fullness, FIFO state logic circuit 440 activates the WAKEUP EVENT signal when the difference between the WRITE POINTER and the READ_POINTER_CLKSLOW [n] is equal to the size of FIFO 253, i.e. the WRITE POINTER has wrapped around and "caught" the READ POINTER. In this case, FIFO 253 has reached a full state and the next write cycle would overwrite valid data such that data would be lost unless it is read from FIFO 253 before new data arrives. In another example of reaching the predetermined degree of fullness, when the difference between the WRITE POINTER and the READ_POINTER_CLKSLOW [n] reaches an amount known as a "watermark" that is less than the size of FIFO 253, FIFO 253 has reached a sufficiently full state that justifies waking up DMAC 117 to read data from FIFO 253. In this case also, FIFO state logic circuit 440 activates the WAKEUP EVENT signal to energy management circuit 130 to cause DMAC 117 to wake up and to read data from FIFO 253. In a particular embodiment, the watermark threshold is user-programmable according to bits in a control register.

In response to the activation of the WAKEUP EVENT signal, energy management circuit 130 changes the POWER STATE signal to cause DMAC 117 to become active and to move the data from FIFO 253 to, for example, RAM 115. In this case, DMAC 117 operates using the DIGITAL_CLK signal, and is capable of reading the data very quickly relative to the speed that low energy sensor gathers more data and writes it to FIFO 253.

Data transmission circuit 300 of FIG. 3 is unable to operate efficiently using these very different clock speeds because DMAC 117 would remain active for two full periods of the CLKSLOW signal required by 2-clock synchronizer 340. During this period, DMAC 117 would continue to be clocked using the CLKFAST signal although it is not doing any useful work. Low energy sensor 172 will eventually deactivate the WAKEUP EVENT signal, but it cannot do so until it can compare the WRITE POINTER to the READ_POINTER [n] and determine that the pointers are the same or the difference has fallen below a low watermark.

Low energy sensor 172 solves this problem, however, by using metastable-free synchronizer circuit 410. MUTEX gate 420 receives two request inputs, and determines which one arrived first, keeping both G1 and a second grant signal known as "G2", not shown in FIG. 4, inactive if the requests arrive so closely in time that it creates metastability, until the metastability resolves. So for example if the LESENSE_CLK is inactive (in this case at a logic low) and the UPDATE READ POINTER signal becomes active at a logic high, then MUTEX gate 420 will activate G1 that corresponds to the R1 input. On the other hand, if the UPDATE READ POINTER signal is inactive at a logic low and the LESENSE_CLK becomes active at a logic high, MUTEX gate 420 will activate G2 (not shown in FIG. 4 and not used in portion 400) while keeping G1 inactive. Thus, DMAC 117 will not complete the FIFO reads until the LESENSE_CLK is low, ensuring that the data transfer does not occur until a safe time in which the WRITE POINTER is stable and FIFO state logic circuit 440 can provide the WAKEUP EVENT signal in the correct logic state. Note that due to the difference in speeds between the CLKFAST and CLKSLOW signals, low energy sensor 172 should provide sufficient hold time after the falling edge of the LESENSE_CLK to ensure that DMAC 117 can complete the necessary reads. Thus, metastable-free synchronizer circuit 410 allows MCU 100 to save a significant amount of energy during low power states while continuing to collect sensor data.

Figure 5:
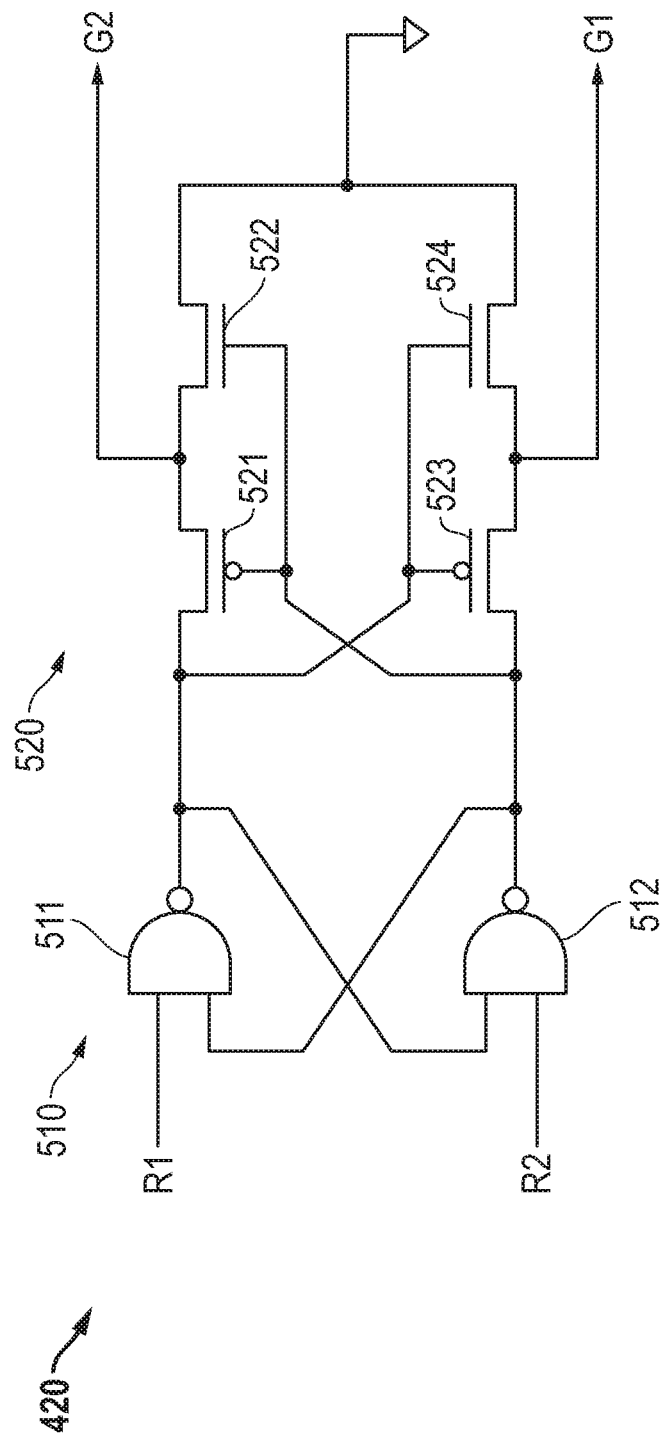
FIG. 5 illustrates in partial block diagram and partial schematic form the mutual exclusion (MUTEX) gate used in the data transmission circuitry of FIG. 4.

FIG. 5 illustrates in partial block diagram and partial schematic form the mutual exclusion (MUTEX) gate 420 used in the data transmission circuitry of FIG. 4. MUTEX gate 420 includes generally a bi-stable latch 510 and a metastability filter 520.

Bi-stable latch 510 includes a NAND gate 511 and a NAND gate 512. NAND gate 511 has a first input forming the R1 terminal, a second input, and an output. NAND gate 512 has a first input connected to the output of NAND gate 511, a second input forming the R2 terminal, and an output connected to the second input of NAND gate 512.

Metastability filter 520 includes transistors 521-524. Transistor 521 is a P-channel metal-oxide-semiconductor (MOS) transistor having a source connected to the output of NAND gate 511, a gate connected to the output of NAND gate 512, and a drain for providing signal G1. Transistor 522 is an N-channel MOS transistor having a drain connected to the drain of transistor 521, a gate connected to the output of NAND gate 512, and a source connected to ground. Transistor 523 is a P-channel MOS transistor having a source connected to the output of NAND gate 512, a gate connected to the output of NAND gate 511, and a drain for providing signal G2. Transistor 524 is an N-channel MOS transistor having a drain connected to the drain of transistor 523, a gate connected to the output of NAND gate 511, and a source connected to ground.

NAND gates 511 and 512 together form a set-reset (SR) flip-flop. As is known, SR flip-flops can be metastable when both of their inputs transition at the same (or about the same) time. During metastability, the outputs of NAND gates 511 and 512 will remain close together in voltage until the metastability resolves. Metastability filter 520, however, filters out the metastability condition by keeping the outputs in inactive (in this case logic low) logic states until the metastability resolves. Metastability filter 520 can only drive G1 or G2 high when the difference the outputs of NAND gates 511 and 512 differ in voltage by more than the respective threshold voltages of transistors 521 and 523. In the context of metastable-free synchronizer circuit 410, MUTEX gate 420 prevents an activation of the synchronized UPDATE READ POINTER signal in response to the activation of the UPDATE READ POINTER signal around transitions of the LESENSE_CLK signal. Thus since low energy sensor 172 only updates its WRITE POINTER signal in synchronism with the LESENSE_CLK signal, metastable-free synchronizer circuit 410 prevents a transition in the READ_POINTER_CLKSLOW signal until the WRITE POINTER is stable.

In particular if the outputs of NAND gates 511 and 512 are near the midpoints, then neither transistor 521 nor transistor 523 can develop a gate-to-source voltage above its respective threshold voltage to pull G1 and G2 to the voltages on their sources, while transistors 522 and 524 are biased much closer to their threshold voltages.

The above-disclosed subject matter is to be considered illustrative, and not restrictive, and the appended claims are intended to cover all such modifications, enhancements, and other embodiments that fall within the true scope of the claims. For example, different data movement circuits can be used. In the context of MCU 100, either DMAC 117 or CPU core 111 can be used as the data movement circuit. A CPU core can be used as the data movement circuit when the MCU has no DMAC. When the MCU supports low power states that allow a DMAC to be active while the CPU core remains inactive, use of the DMAC controller may save more power. There are also various conditions in which the data producer, e.g. low energy sensor 172, can trigger data movement decisions, including either when the FIFO is full or when the number of free entries falls below a programmable watermark. The date transmission circuit and technique disclosed in this application can also be used in various types of circuits, including MCUs, microprocessors, application specific integrated circuits (ASICs), gate arrays, mixed signal processing chips, and the like.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A circuit, comprising:
   a data producer for storing input data in a buffer in response to a slow clock signal, and providing read data from said buffer in response to a read pointer signal; and a data movement circuit operable to control said data producer to read said input data from said buffer using said read pointer signal and to provide an update read pointer signal in response to reading said input data, said data movement circuit operating in response to a fast clock signal having a higher frequency than said slow clock signal, wherein the data producer comprises:
a metastable-free synchronizer circuit having a first input for receiving said update read pointer signal, a second input for receiving said slow clock signal, a third input for receiving said read pointer signal, and an output for providing a synchronized read pointer signal that is equal to said read pointer signal except between a change in said read pointer signal while said slow clock signal is active until an inactivation of said slow clock signal, wherein said buffer provides said read data to said data movement circuit in response to said synchronized read pointer signal.

2. The circuit of claim 1, wherein:
said data producer further has a second output for providing a control signal in an active state to indicate that said buffer has reached a predetermined fullness, and in an inactive state to indicate that said buffer no longer has said predetermined fullness in response to an activation said synchronized read pointer signal without using said slow clock signal; and
the circuit further enables said data movement circuit in response to an activation of said control signal, and subsequently disables said data movement circuit in response to a deactivation of said control signal.

3. The circuit of claim 2, wherein said data producer stores data in said buffer according to a write pointer signal, and said data producer measures whether said buffer has said predetermined fullness based on a difference between said write pointer signal and said synchronized read pointer signal.

4. The circuit of claim 1, wherein said buffer comprises a first-in, first-out (FIFO) buffer.

5. The circuit of claim 1, wherein said data movement circuit comprises a direct memory access controller (DMAC).

6. The circuit of claim 1, wherein said data movement circuit comprises a central processing unit (CPU) core that moves data in response to stored program instructions.

7. The circuit of claim 1, wherein said fast clock signal is faster than said slow clock signal by at least one order of magnitude.

8. The circuit of claim 1, wherein said fast clock signal is faster than said slow clock signal by at least three orders of magnitude.

9. The circuit of claim 1, wherein said metastable-free synchronizer circuit comprises a mutual exclusion (MUTEX) gate.

10. The circuit of claim 9, wherein said MUTEX gate comprises:
a bi-stable latch having a first input for receiving said slow clock signal, a second input for receiving said synchronized read pointer signal, and first and second outputs; and
a metastability filter having input coupled to said first and second outputs of said bi-stable latch, and an output for providing a metastable-free update read pointer signal, wherein said metastability filter provides said metastable-free update read pointer signal in response to said first and second outputs of said bi-stable latch when said slow clock signal and said update read pointer signal do not change at the same time, and keeps said metastable-free update read pointer signal inactive until said slow clock signal completes a transition when said slow clock signal and said update read pointer signal change at the same time.

11. The circuit of claim 10, wherein said bi-stable latch comprises:
a first NAND gate having a first input for receiving said update read pointer signal, a second input, and an output for providing said first output of said bi-stable latch; and
a second NAND gate having a first input for receiving said slow clock signal, a second input coupled to said output of said first NAND gate, and an output coupled to said second input of said first NAND gate for providing said second output of said bi-stable latch.

12. The circuit of claim 10, wherein said metastability filter comprises:
a first P-channel transistor having a source coupled to said first output of said bi-stable latch, a gate coupled to said second output of said bi-stable latch, and a drain for providing a first output of said metastable-free synchronizer circuit;
a first N-channel transistor having a drain coupled to said drain of said first P-channel transistor, a gate coupled to said second output of said bi-stable latch, and a drain coupled to ground;
a second P-channel transistor having a source coupled to said second output of said bi-stable latch, a gate coupled to said first output of said bi-stable latch, and a drain for providing a second output of said metastable-free synchronizer circuit; and
a second N-channel transistor having a drain coupled to said drain of said second P-channel transistor, a gate coupled to said first output of said bi-stable latch, and a drain coupled to ground.

13. The circuit of claim 1, wherein the circuit further comprises at least one sensor having an output, and said data producer has an input coupled to said output of said at least one sensor and provides said input data to said buffer in response to said output of said sensor.

14. A microcontroller, comprising:
a sensor circuit for storing sensor data in a buffer in response to a slow clock signal, and providing read sensor data from said buffer in response to a read pointer signal;
a data movement circuit operable in an active mode and a first low-power mode to control said sensor circuit to read said sensor data from said buffer using said read pointer signal, and to provide an update read pointer signal in response to reading said sensor data, said data movement circuit operating in response to a fast clock signal having a higher frequency than said slow clock signal; and
wherein said sensor circuit comprises:
a metastable-free synchronizer circuit having a first input for receiving said update read pointer signal, a second input for receiving said slow clock signal, a third input for receiving said read pointer signal, and an output for providing a synchronized read pointer signal that is equal to said read pointer signal except between a change in said read pointer signal while said slow clock signal is active until an inactivation of said slow clock signal, wherein said buffer provides said read sensor data to said data movement circuit in response to said synchronized read pointer signal.

15. The microcontroller of claim 14, wherein:

said sensor circuit provides a control signal in an active state to indicate that said buffer has reached a predetermined fullness, and in an inactive state to indicate that said buffer no longer has said predetermined fullness in response to an activation of said update read pointer signal without using said slow clock signal; and the microcontroller further enables said data movement circuit in response to an activation of said control signal, and subsequently disables said data movement circuit in response to a deactivation of said control signal.

16. The microcontroller of claim 15, wherein said sensor circuit stores data in said buffer according to a write pointer signal, and said sensor circuit measures whether said buffer has said predetermined fullness based on a difference between said write pointer signal and said synchronized read pointer signal.

17. The microcontroller of claim 14, wherein:

said sensor circuit further has a second output for providing a wakeup signal, said data movement circuit comprises a direct memory access controller (DMAC) that is operable in said active mode and a first low power mode and is inactive in a second low power mode, and the microcontroller further comprises:

a central processing unit for executing stored program instructions in an active mode, and for remaining inactive in said first low power mode and said second low power mode; and an energy management circuit responsive to said wakeup signal for changing the microcontroller from said second low power mode to said first low power mode.

18. The microcontroller of claim 14, wherein said buffer comprises a first-in, first-out (FIFO) buffer.

19. The microcontroller of claim 14, wherein said fast clock signal is faster than said slow clock signal by at least one order of magnitude.

20. The microcontroller of claim 14, wherein said fast clock signal is faster than said slow clock signal by at least three orders of magnitude.

21. The microcontroller of claim 14, wherein said metastable-free synchronizer circuit comprises a mutual exclusion (MUTEX) gate.

22. The microcontroller of claim 21, wherein said MUTEX gate comprises:

a bi-stable latch having a first input for receiving said slow clock signal, a second input for receiving said update read pointer signal, and first and second outputs; and a metastability filter having input coupled to said first and second outputs of said bi-stable latch, and an output for providing a metastable-free update read pointer signal, wherein said metastability filter provides said metastable-free update read pointer signal in response to said first and second outputs of said bi-stable latch when said slow clock signal and said update read pointer signal do not change at the same time, and keeps said metastable-free update read pointer signal inactive until said slow clock signal completes a transition when said slow clock signal and said update read pointer signal change at the same time.

23. The microcontroller of claim 22, wherein said bi-stable latch comprises:

a first NAND gate having a first input for receiving said update read pointer signal, a second input, and an output for providing said first output of said bi-stable latch; and a second NAND gate having a first input for receiving said slow clock signal, a second input coupled to said output of said first NAND gate, and an output coupled to said second input of said first NAND gate for providing said second output of said bi-stable latch.

24. The microcontroller of claim 22, wherein said metastability filter comprises:

a first P-channel transistor having a source coupled to said first output of said bi-stable latch, a gate coupled to said second output of said bi-stable latch, and a drain for providing a first output of said metastable-free synchronizer circuit;

a first N-channel transistor having a drain coupled to said drain of said first P-channel transistor, a gate coupled to said second output of said bi-stable latch, and a drain coupled to ground;

a second P-channel transistor having a source coupled to said second output of said bi-stable latch, a gate coupled to said first output of said bi-stable latch, and a drain for providing a second output of said metastable-free synchronizer circuit; and a second N-channel transistor having a drain coupled to said drain of said second P-channel transistor, a gate coupled to said second output of said bi-stable latch, and a drain coupled to ground.

25. A method, comprising:

storing input data in a buffer at a location indicated by a write pointer in synchronism with a slow clock signal;

providing a control signal to indicate that said buffer has reached a predetermined condition;

reading data from said buffer in response to said control signal at a location indicated by a read pointer signal in synchronism with a fast clock signal having a higher frequency than said slow clock signal;

generating an update read pointer signal in synchronism with said fast clock signal in response to reading said input data from said buffer; and forming a synchronized read pointer signal in response to said read pointer signal and said update read pointer signal using a metastable-free synchronizer circuit that forms a metastable-free update read pointer signal as said update read pointer signal when said slow clock signal and said update read pointer signal do not change at the same time, and keeps said metastable-free update read pointer signal inactive except between a change in said read pointer signal while said slow clock signal is active until an inactivation of said slow clock signal, and latches said read pointer signal in response to said metastable-free update read pointer signal.

26. The method of claim 25, wherein storing said input data in said buffer comprises storing said input data in a first-in, first-out (FIFO) buffer.

27. The method of claim 25, wherein reading data from said buffer comprises reading said input data from said buffer using a direct memory access controller (DMAC).

28. The method of claim 27, further comprising changing said DMAC from an inactive mode to an active mode in response to said control signal.

29. The method of claim 25, wherein reading data from said buffer comprises reading data from said buffer using a central processing unit (CPU) core that moves said input data in response to stored program instructions.

30. The method of claim 25, wherein said fast clock signal is faster than said slow clock signal by at least one order of magnitude.

31. The method of claim 30, wherein said fast clock signal is faster than said slow clock signal by at least three orders of magnitude.

32. The method of claim 25, wherein providing said control signal to indicate that said buffer has reached said predetermined condition comprises providing said control signal to indicate that said buffer has reached a predetermined degree of fullness.

* * * * *